United States Patent [19]

Pollard et al.

[11] 4,404,582
[45] Sep. 13, 1983

[54] MOUNTING ARRANGEMENT FOR DISC MOUNTED SEMICONDUCTOR DEVICES

[75] Inventors: David D. Pollard, Amanda; Gary E. Krajci, American, both of Ohio

[73] Assignee: Westinghouse Electric Corp., Pittsburgh, Pa.

[21] Appl. No.: 211,170

[22] Filed: Nov. 28, 1980

[51] Int. Cl.³ .......................................... H01L 23/42
[52] U.S. Cl. ...................................... 357/79; 357/76
[58] Field of Search ................................... 357/79, 76

[56] References Cited

U.S. PATENT DOCUMENTS 4,247,864  1/1981  Lockard ............................. 357/79

Primary Examiner—Martin H. Edlow
Attorney, Agent, or Firm—G. H. Telfer

[57] ABSTRACT

An assembly of disc mounted, compression bonded-encapsulated, semiconductor devices is provided with positioning elements from the sheet metal serving as a heat sink and electrical bus adjacent the device contact face. A plurality of holding fingers stamped from the sheet metal grip the device side surface and permit placing the device in position accurately so the clamping elements apply proper force along the device axis.

2 Claims, 3 Drawing Figures

MOUNTING ARRANGEMENT FOR DISC MOUNTED SEMICONDUCTOR DEVICES

GOVERNMENT CONTRACT

The Government has rights in this invention pursuant to Subcontract E93030 with Westinghouse under prime Contract No. N00019-79-C-0165 awarded by the Department of the U.S. Navy.

BACKGROUND AND SUMMARY OF THE INVENTION

This invention relates to assemblies of semiconductor devices and particularly to assemblies accurately positioning disc mount semiconductor devices in relation to heat sink/bus bar elements.

Disc mount semiconductor devices are those in which a semiconductor device is encapsulated in a package having opposing circular faces to which pressure contact is made, without bonding, for electrical continuity to regions of the enclosed device as well as for heat transfer. Such packaged devices are well known and widely used and may include either diodes, transistors, or thyristors, in accordance with known practice. The term "hockey puck" is often used in referring to devices encapsulated in this manner because of similarities of appearance. Such devices are also sometimes referred to as compression bonded encapsulated (CBE) devices.

The nature of disc mount devices is such that it is necessary to apply a predetermined force, typically in a range from about 1000 to about 2000 pounds, that is accurately positioned, typically specified as within 1/32 of an inch, at the central axis of the device in order to ensure good thermal and electrical contact. In use, one or more of the semiconductor devices, frequently several, are stacked with intermediate sheet metal elements that serve as heat sinks and electrical conductors. In assembly, it is necessary for the assembler to ensure the proper axial alignment of the devices so that the stack will have the required force applied along the central axis of the devices. A misplacement of a device by more than about 1/32 of an inch may be fatal to its reliable operation because of the wrong amount of pressure on the contact faces, sometimes referred to as pole faces.

The art has addressed the problem of accurate location of disc mount devices by adopting a standard device and heat sink configuration so they are intended to mate and provide accurate location. In accordance with this technique the semiconductor device manufacturer provides in each major face of the device a hole or indentation that is accurately centrally located and which is to receive a pin or bump that is integrally formed with the heat sink/conductor element. In concept, this requires the assembler merely to position the device with the central aperture located on the pin in the sheet metal element. In practice, this takes a considerable amount of time on the part of the assembler to ensure accurate location and may result in misalignment and device failure. For example, the device may be located so that the pin is not aligned with the aperture because it is so small the assembler may not feel the misalignment. Upon clamping the assembly to provide the required amount of pressure, the pin may penetrate the relatively soft metal, such as copper alloy, pole face of the device, with serious detriment to device performance. The assembly requires a high degree of sensitive feeling on the part of the assembler because of the inability to view the location of the pin from the sheet metal heat sink within the pole face aperture.

Disc mounted semiconductor devices and their mounting by the pin-in-hole technique, as well as clamping means therefore, are generally described in Westinghouse Application Data, Mounting Power Semiconductors, January 1978, especially pp. G47-G49, which is herein incorporated by reference.

It is understood that others have at least attempted to provide some form of peripheral and visible locating means for disc mounted devices on heat sinks, such as a centering ring in which the device is located with the centering ring attached to the heat sink. Unfortunately, this requires precisely dimensioned centering rings and is inherently undesirable because of requiring an additional part member.

The present invention achieves the required precise axial location of disc mounted devices, whether used singly or in a multiple stack, in relation to their adjacent heat sink/conductor elements without requiring any additional part members and without requiring any great care on the part of the assembler.

In accordance with the present invention, each of the metal sheets for making electrical and thermal contact with respective contact faces of a device is provided with mechanically deformed elements of the sheet metal material that engage the edge surface of the device and hold it in a position so that a stack of such devices is accurately located on the axis. The deformed elements are preferably a plurality of holding fingers stamped from the material of the sheet and deformed to provide edges that grip the adjacent device. This type of assembly requires merely that there be accuracy in the die used to stamp the fingers from the sheet metal. The assembler has merely to force, with a minor interference fit, the device into the array of peripheral fingers, which may number three or more, in order to ensure accurate location.

A single sheet metal element that serves to contact two adjacent devices with electrically common faces is formed by having stamped fingers that protrude from each of its major surfaces that are located on the same circle so that the two adjacent devices are certainly located in the proper position.

The assembly not only relieves the assembler of any high skill in assembly but it also permits by direct viewing the assurance that the device is accurately positioned. This makes it possible not only to position the device easily but to make sure that both before and after the application of the clamping pressure accurate positioning is maintained.

DESCRIPTION OF THE PREFERRED EMBODIMENT

Figure 1:
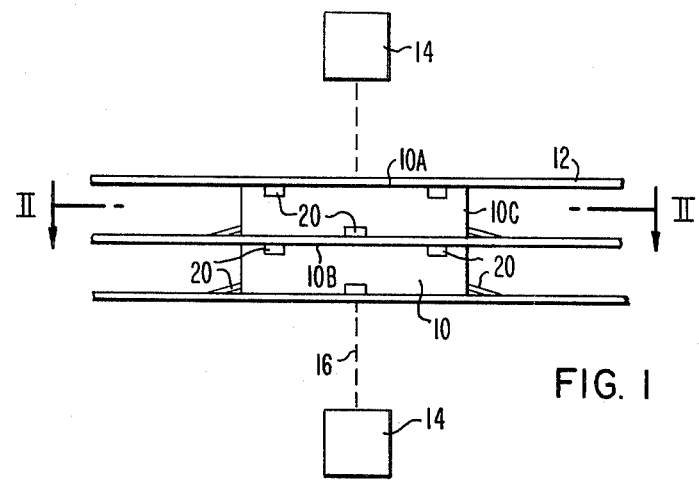
FIG. 1 is a partial elevation view of a semiconductor device assembly in accordance with one embodiment of the invention.
Figure 2:
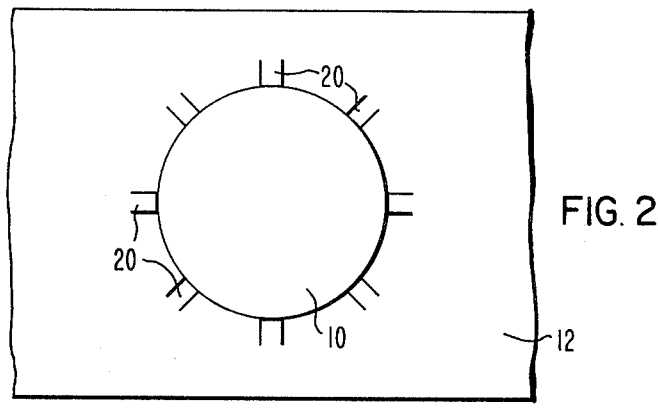
FIG. 2 is a plan view taken along line II—II of FIG. 1.

Referring to the drawing, FIG. 1 shows a stack of disc mounted, compression bonded encapsulated semiconductor devices 10 assembled with adjacent heat sink/electrical bus elements 12. The assembly may include several devices 10 although only two are shown to illustrate the principles of the invention. Each of the semiconductor devices 10 is a diode, transistor, thyristor, or the like packaged in accordance with known techniques to provide opposing contact faces 10A and 10B to which pressure contact is made for electrical continuity and heat transfer between the internal semiconductor elements and the adjacent bar 12. The semiconductor devices 10 each have a circular configuration as shown in the plan view of FIG. 2. The enclosure leaves an edge surface 10C of cylindrical form extending around the outer periphery of the device between the contact faces 10A and 10B.

Each of the heat sink/electrical bus bar elements 12 is a metal sheet that communicates with additional portions of an electrical circuit in which the semiconductor devices 10 are connected.

The stack is held together and the devices 10 are held in pressure contact with their adjacent heat sink/electrical bus elements 12 by a force supplying means 14 that is centrally located over the central axes of the devices 10 on line 16. Prior means, such as those employing leaf springs and clamping bolts, are suitable for applying the prescribed amount of pressure, such as a force of between about 1000 and 2000 pounds, to the stack.

Figure 3:
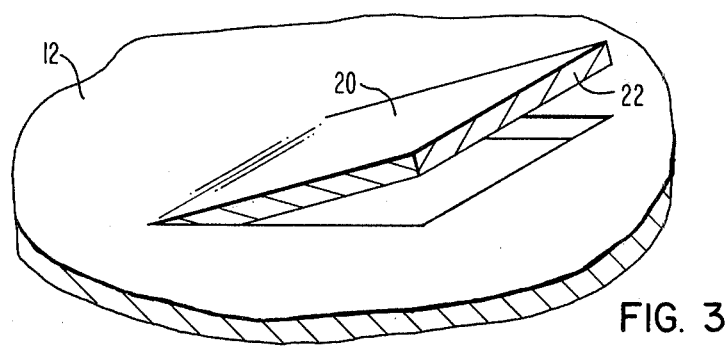
FIG. 3 is a partial perspective view of the assembly of FIGS. 1 and 2.

In accordance with the present invention the assembly includes positioning means comprising mechanically deformed elements 20 of the material of the metal sheet 12 that engage the edge surface 10C of the adjacent semiconductor device 10 so that they all are easily placed in and stay in axial alignment. In this embodiment these mechanically deformed elements are holding fingers stamped from the sheet material of the heat sink/electrical bus elements that are bent slightly out of the plane of the sheet 12 to provide edges 22 that bear against the edge 10C of the adjacent device, see FIG. 3.

As shown, the heat sink/electrical bus element 12 which has a device 10 on each side of it has such mechanically deformed elements 20 extending from both its surfaces so that it retains and positions the semiconductor devices 10 on both sides.

To carry out the invention, it is merely necessary to have an accurately dimensioned stamping die to form the holding fingers 20 of the sheet metal plate 12. Once such plates are formed, then it is a straightforward matter for an assembler to sequentially stack the plates 12 and the semiconductor devices 10 with assurance of their proper fit and alignment. This is essential because in the event that the stack is somewhat out of alignment, such as by more than about 1/32 of an inch, the application of pressure to the stack will not provide reliable good contact and the devices 10 will misoperate or fail.

As presently practiced, and to provide further details by way of example, the semiconductor devices in question are in a package that has a major surface diameter of about 0.75 inch so that the need to center the device for accurate pressure application requires positioning with a high degree of accuracy (within about 0.03 inch) relative to the overall dimensions of the device. The prior practice of providing a central pin on the sheet metal element that is fitted to an aperture in the device case has been found unsatisfactory because of the inability to see well enough to ensure the location of the pin in the aperture and because the pin is so small that it requires a very delicate touch to ensure by feel that it is properly located. Now, however, the holding fingers 20 which are readily visible from the periphery do not require any delicate touch to provide accurate placement of the device.

The stamping die that provides the holding fingers 20 is dimensioned to provide the fingers in a circular configuration, such as three or four in a circle, with a dimensional offset from the outer diameter of the semiconductor device of approximately 15 to 20 mils. This means that when the holding fingers 20 are formed and deformed from the plane of the metal sheet they provide an edge 22 that requires an interference fit with the periphery 10C of the device. The metal sheet is usually selected of material such as copper, aluminum, magnesium or alloys thereof, typically up to about $\frac{1}{8}$ inch thick. The die used to stamp the holding fingers 20 is to be suitably dimensioned in accordance with the thickness and composition of the metal sheet.

As CBE devices are presently commercially available, they have a pole face thickness that is sufficiently great to accommodate the pin-receiving aperture. In accordance with the present invention, in which the CBE device is gripped only at its periphery, the pin-receiving aperture normally provided in its pole face is unneeded and it is now possible to encapsulate CBE devices without the extra thickness formerly required on the pole face and without the aperture. This is attractive in many applications where relatively large numbers of devices are used and where weight and space considerations are important.

It is therefore seen that the present invention provides a way to hold disc mounted devices in accurate axial alignment in a stack associated with pressure-applying equipment so that the application of pressure along the central axis ensures the proper pressure between the device and the adjacent heat transfer/electrical bus sheet metal. This is all achieved in an arrangement which does not require a high degree of skill to assemble and which permits visual inspection during assembly and after assembly.

We claim:

1. A semiconductor device assembly comprising:
   a stack including a plurality of disc type semiconductor devices in axial alignment and a plurality of metal sheets, serving as both heat sinks and electrical conductors, of which one is located at each major face of each of said devices including at least one metal sheet that is directly between two of said devices;
   each of said metal sheets having a plurality of holding fingers stamped from the material thereof and deformed to grip the edge of the adjacent device, with said at least one metal sheet that is directly between two devices having holding fingers stamped and deformed away from both of the surfaces of said sheet; and,
   means for applying a predetermined pressure along the axis of said devices.

2. A semiconductor device assembly in accordance with claim 1 wherein:
   each of said plurality of disc type semiconductor devices has circular opposing major faces and each of said major faces of each of said devices is entirely in pressure contact with a continuous and planar surface of one of said metal sheets.

* * * * *